United States Patent
Zeng et al.

(10) Patent No.: US 8,138,835 B2
(45) Date of Patent: Mar. 20, 2012

(54) WIDE BAND LNA WITH NOISE CANCELING

(75) Inventors: Yi Zeng, Fremont, CA (US); Xiaoyong Li, Santa Clara, CA (US); Rahul A Apte, San Francisco, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/796,593

(22) Filed: Jun. 8, 2010

(65) Prior Publication Data
US 2011/0193635 A1    Aug. 11, 2011

Related U.S. Application Data

(60) Provisional application No. 61/303,589, filed on Feb. 11, 2010.

(51) Int. Cl.
*H03F 3/04* (2006.01)
(52) U.S. Cl. ............ 330/296; 330/149; 330/264
(58) Field of Classification Search .......... 330/262–276, 330/149, 277
See application file for complete search history.

(56) References Cited

U.S. PATENT DOCUMENTS

| | | | |
|---|---|---|---|
| 5,513,389 A | 4/1996 | Reeser et al. | |
| 7,642,816 B2 | 1/2010 | Kuo et al. | |
| 2007/0030076 A1 | 2/2007 | Kim et al. | |
| 2008/0036537 A1 | 2/2008 | Syed | |
| 2008/0079494 A1 | 4/2008 | Aram | |
| 2009/0027128 A1* | 1/2009 | Ishiguro | 330/278 |
| 2009/0153244 A1 | 6/2009 | Cabanillas et al. | |

FOREIGN PATENT DOCUMENTS

WO    WO2008041948 A1    4/2008

OTHER PUBLICATIONS

Bruccoleri F et al: "Wide-Band CMOS Low-Noise Amplifier Exploiting Thermal Noise Canceling", IEEE Journal of Solid-State Circuits, IEEE Service Center, Piscataway, NJ, USA, vol. 39, No. 2, Feb. 1, 2004, pp. 275-282, XP011106496, ISSN: 0018-9200, DOI: DOI.10.1109/JSSC.2003.821786.

(Continued)

*Primary Examiner* — Hieu Nguyen
(74) *Attorney, Agent, or Firm* — Ramin Mobarhan

(57) ABSTRACT

Techniques to improve low noise amplifiers (LNAs) with noise canceling are described. LNA includes a first and a second amplifier which work together to noise cancel the noise generated at an input stage circuit. The input stage circuit receives an RF signal and is characterized by a first node and a second node. The first amplifier converts a noise voltage at the first node into a first noise current at an output of the first amplifier. The second amplifier is directly coupled to the output of the first amplifier and provides noise canceling by summing the first noise current with a second noise current generated by the second amplifier as a function of the noise voltage at the second node. The proposed techniques eliminate the need for large ac coupling capacitors and reduce the die size occupied by the LNA. The elimination of ac coupling capacitors between amplification stages of the LNA allows current reuse resulting in reduced current consumption.

11 Claims, 4 Drawing Sheets

OTHER PUBLICATIONS

Chih-Fan Liao et al: "A Broadband Noise-Canceling CMOS LNA for 3.1-10.6-GHz UWB Receivers", IEEE Journal of Solid- State Circuits, IEEE Service Center, Piscataway, NJ, USA, vol. 42, No. 2, Feb. 1, 2007, pp. 329-339, XP011161672, ISSN: 0018-9200, DOI: DOI:10.1109/JSSC.2006.889356.

International Search Report and Written Opinion—PCT/US2011/024516—ISA/EPO—May 26, 2011.

Mehdi Forouzanfar et al: "High gain CMOS UWB LNA employing thermal noise cancellation", Ultra-Wideband, 2009. ICUWB 2009. IEEE International Conference on, IEEE, Piscataway, NJ, USA, Sep. 9, 2009, pp. 118-122, XP031547685, ISBN: 978-1-4244-2930-1.

Wu J M et al: "A low power WiMAX LNA with noise cancellation", Communications and Networking in China, 2008. Chinacom 2008. Third International Conference on, IEEE, Piscataway, NJ, USA, Aug. 25, 2008, pp. 286-288, XP031364836, ISBN: 978-1-4244-2373-6.

Blaakmeer et al, "Wideband Balun-LNA With Simultaneous Output Balancing, Noise-Canceling and Distortion-Canceling", IEEE Journal of Solid-State circuits, pp. 1341-1350, vol. 43, No. 6, Jun. 2008.

* cited by examiner

WIDE BAND LNA WITH NOISE CANCELING

CLAIM OF PRIORITY UNDER 35 U.S.C. §119

The present application for patent claims priority to Provisional Application No. 61/303,589, entitled "Noise Cancelling Wideband LNA" filed Feb. 11, 2010, and assigned to the assignee hereof and hereby expressly incorporated by reference herein

TECHNICAL FIELD

The present disclosure relates to electronics and more particularly to the field of wide band low noise amplifiers for radio frequency integrated circuits.

BACKGROUND

Mobile, wireless, and/or handheld portable devices increasingly become multifunctional communication devices. These handheld portable devices integrate an increasingly wide range of functions for handling a plurality of wireless communication services. For example, a single handheld portable device may include an FM receiver along with GPS, CDMA, Wi-Fi, WiMAX, CDMA2000 and 3G receivers.

FM receivers require wideband low-noise amplifiers (LNAs) as they operate from 76 MHz to 108 MHz. Specifications requirements for FM receiver sensitivity include a wide band LNA with sufficient gain and a noise figure (NF) that is below 3 dB. This NF might be easily achievable for LNAs using source degenerating inductors.

Moreover, source impedance matching is usually required to limit reflections on an antenna or to avoid alterations of the characteristics of any RF filter preceding the LNA. An LNA exploiting an inductor achieves such requirements, but only in a narrow frequency band around resonance.

Inductors tend to occupy significant die area. As in newer CMOS technologies the area costs increase, area consuming inductors increase the overall device cost. FM receivers are considered auxiliary products in a multifunctional communication device and they must occupy very small die area so they do not impact the overall device cost. Thus, the use of inductors for FM receivers is prohibitive.

Alternative solutions for impedance matching have to be considered to achieve power matching at the input of the LNA. Alternative solutions for impedance matching have to be considered to achieve power matching at the input of the LNA. One such solution may include adding input resistive termination to a common source gain stage of the LNA. An alternative solution is to use a common gate as input stage of the LNA. Yet another solution is to use a shunt feedback common source stage as input stage of the LNA. These methods would provide a good power matching but may greatly degrade the NF. Most LNAs based on resistive termination provide good power matching but greatly degrade the NF.

To decouple impedance matching from noise figure various circuit techniques that include noise canceling have been proposed. Most of these circuit techniques are based on the following principle of operation: An RF signal appears at a first node while a replica of the RF signal, proportional to the RF signal, appears at a second node. However, the thermal noise contribution due to the input stage of the LNA appears with opposite polarity at each node. Thus, noise cancellation may be achieved by summing the RF signal and its replica.

Various such topologies have been shown in the literature. Yet, there is always a need to improve them and achieve even smaller die size and even lower power consumption, particularly for auxiliary components such as FM receivers.

FIG. 1 shows an implementation of an LNA with noise canceling for an FM receiver.

The LNA includes input stage circuit 12, first amplifier 14 and second amplifier 16. Input stage circuit 12, includes MOS transistor $M_1$ in a common gate configuration coupled to load resistor $R_L$. First amplifier 14 comprises a pair of complimentary MOS transistors, M2p and M2n, in a common source configuration and is ac-coupled to the second amplifier through capacitors $C_{3ac}$ and $C_{4ac}$. Each of these capacitors along with each of resistors $R_{1DG}$ and $R_{2DG}$, respectively, forms a high-pass filter for the signal appearing at the output of first amplifier 14. Typically, $R_{1DG}$ is equal to $R_{2DG}$. The impedance at the input of the second amplifier, and more specifically at the source node of transistors M3n and M3p, is 1/gm in parallel with $R_{1DG}$ or $R_{2DG}$. The transconductance of transistors M3n and M3p is defined as gm. Given reasonable transistor size and biasing current, the impedance looking into the input of the second stage may be well below 1K ohm. Within the FM band, (76 MHz~108 MHz), the signal at the output of the first amplifier has to pass through the high-pass filter with minimum loss, which dictates that the high pass corner of the high-pass filter has to be much lower than the lower operating frequency of the FM band (76 MHz). Thus, ac coupling capacitors $C_{3ac}$ and $C_{4ac}$ have to be quite large to meet this requirement.

The use of large capacitors is undesirable not only because they occupy significant die area but also because they do not allow sharing or reusing of current between the different amplification stages of the LNA; thus, resulting in noise canceling solutions with a high current consumption LNA.

It is desirable to design a noise canceling LNA that does not require either a large inductor or large capacitors and that is suitable for low current consumption.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to various embodiments of an improved LNA with noise canceling. The disclosed solutions eliminate the need for large ac coupling capacitors thus reducing the die size occupied by the LNA. Furthermore, the elimination of ac coupling capacitors between amplification stages of the LNA allows current reuse thus resulting in low current consumption.

According to the present disclosure, the LNA incorporates an input stage circuit, a first amplifier and a second amplifier. The input stage circuit receives an RF signal and it is biased to provide matching to a source impedance. The first amplifier amplifies a first voltage appearing at the input of the LNA. The first voltage has a first noise voltage component due to the noise of the input stage devices. The first amplifier converts the first noise voltage component into a first noise current and feeds the first noise current to the second amplifier.

A second amplifier amplifies a second voltage. The second voltage is proportional to the first voltage and has a second noise voltage component. The second noise voltage component is proportional and of opposite phase to the first noise voltage. The second amplifier converts the second noise voltage component into a second noise current and adds the second noise current to the first noise current so that the first noise current and the second noise current cancel each other at the output of the LNA.

Figure 1:
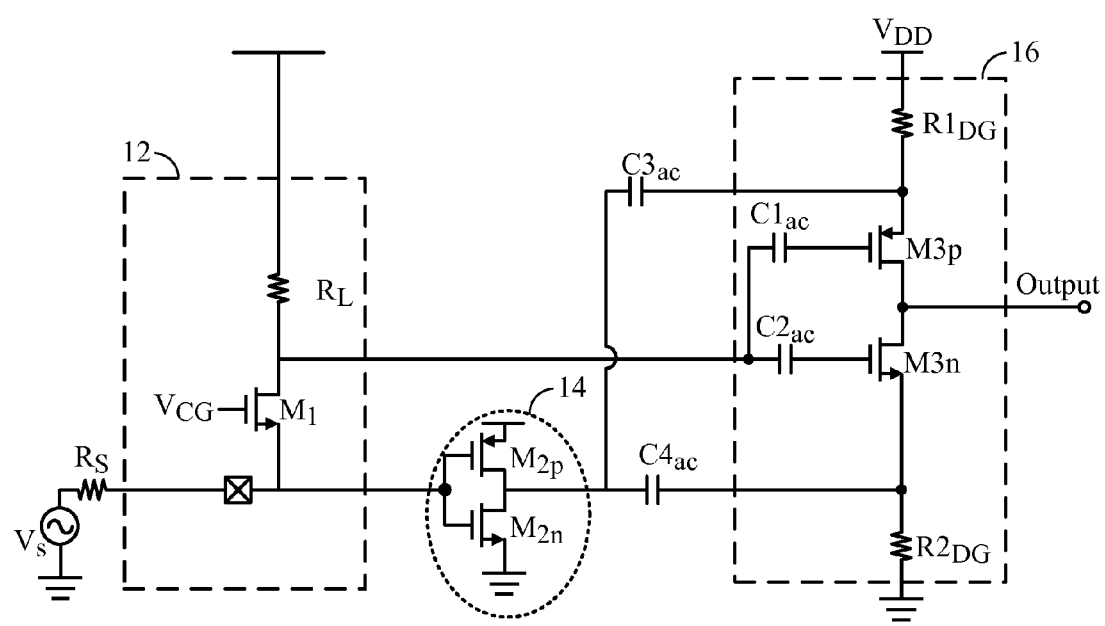
FIG. 1 shows an implementation of an LNA with noise canceling for an FM receiver.

The first amplifier is directly coupled, dc coupled, to the second amplifier. As a result, the disclosed solution uses smaller ac capacitors in the LNA when compared with previous solutions such as the solution shown in FIG. 1.

Figure 2:
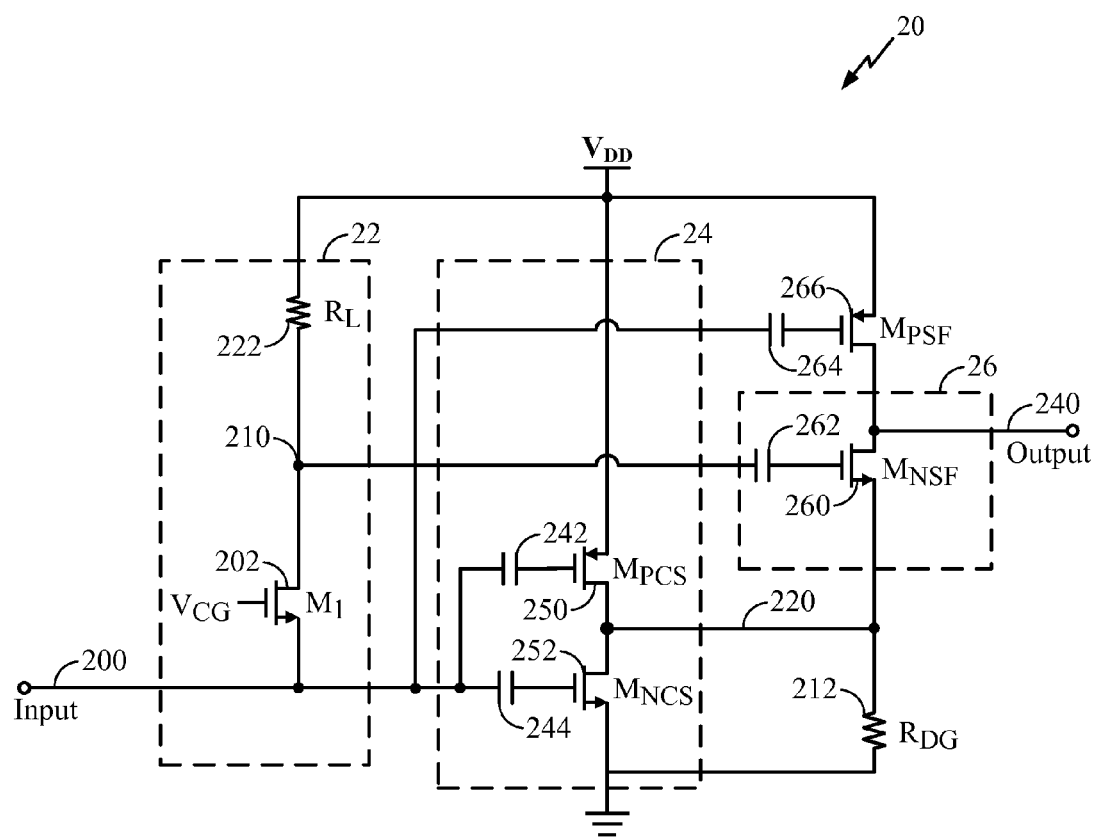
FIG. 2 is a schematic diagram of an exemplary embodiment of an LNA with noise canceling.

FIG. 2 is a schematic diagram of an exemplary embodiment of an LNA with noise canceling. LNA 20 includes input stage circuit 22, first amplifier 24 and second amplifier 26. Input stage circuit 22, includes MOS transistor 202 ($M_1$) in a common gate configuration coupled to load resistor 222 ($R_L$). First amplifier 24 includes a pair of complementary MOS transistors 250, 252 ($M_{PCS}$, $M_{NCS}$) and capacitors 242 and 244. Second amplifier 26 comprises MOS transistor 260 ($M_{NSF}$) and capacitor 262. MOS transistor 260 is in a source follower configuration.

The gates of MOS transistors 250 and 252 are coupled to the input of the LNA, node 200, through capacitors 242 and 244, respectively. The source of first MOS transistor 250 of the pair of complementary MOS transistors is coupled to the positive supply. The drain of first MOS transistor 250 of the pair is coupled to the drain of second MOS transistor 252 of the pair and to the source of MOS transistor 260. The source of second MOS transistor 252 of the pair is coupled to ground.

LNA 20 further comprises MOS transistor 266 ($M_{PSF}$) and resistor 212 ($R_{DG}$). The gate of MOS transistor 266 is coupled to the input terminal of the LNA through capacitor 264, the source of MOS transistor 266 is coupled to the positive power supply and the drain of MOS transistor 266 is coupled to the output of the LNA. MOS transistor 266 is used as a third amplifier to improve the overall gain of the LNA. Resistor 212 has one terminal coupled to the source of MOS transistor 260 and another terminal coupled to ground. Resistor 212 is used as a degeneration resistor to MOS transistor 260.

First amplifier 24 senses a first noise voltage appearing at node 200. Node 200 is the input of the LNA. The first amplifier converts the first noise voltage into a first noise current at node 220. Node 220 is the output of the first amplifier.

Second amplifier 26 senses a second noise voltage appearing at node 210. Node 210 is the output of the input stage circuit. The second noise voltage is proportional to the first noise voltage. Second amplifier 26 converts the second noise voltage into a second noise current, which appears at node 240. Node 240 is the output of the second amplifier and is also the output of the LNA.

Second amplifier 26 sums the first and the second noise currents at the output of the LNA in such a way that the first and the second noise currents substantially cancel each other. As a result, the noise due to the input stage circuit is substantially canceled at the output of the LNA.

The transconductance of the first amplifier is designed as a function of the transconductance of the second amplifier in order to set the first noise current equal and of opposite sign to the second noise current.

The first amplifier is directly coupled, dc coupled, to the second amplifier. As a result, the LNA uses smaller ac capacitors when compared with previous solutions such as that shown in FIG. 1.

Figure 3:
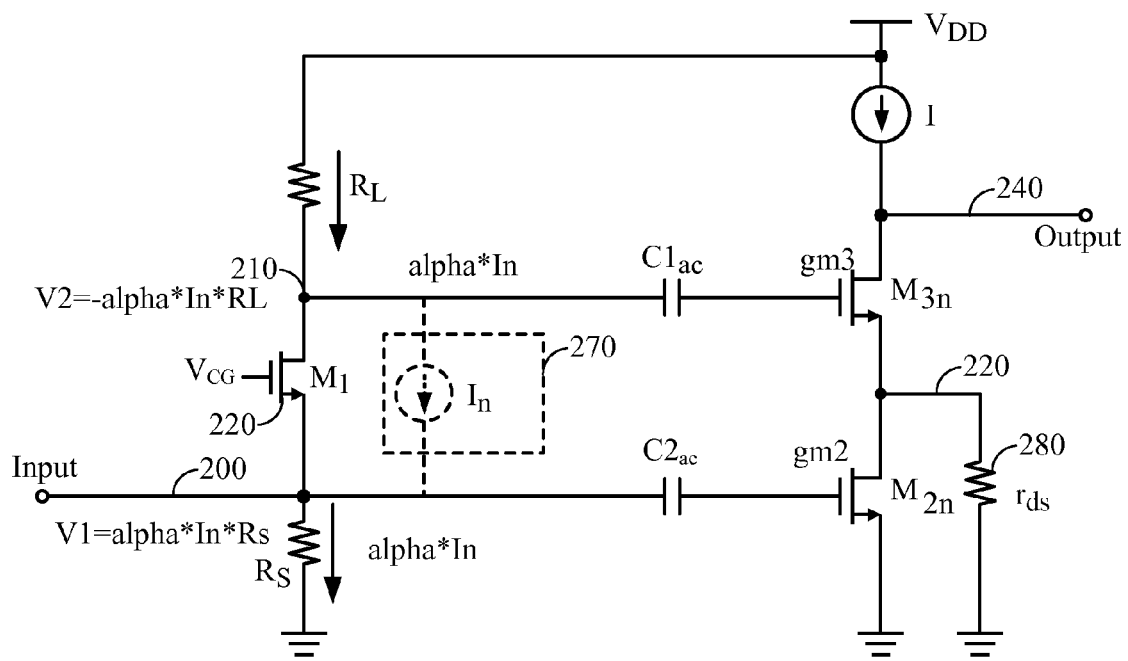
FIG. 3 is a simplified schematic diagram illustrating the noise canceling principle for the LNA exemplary embodiment of FIG. 2.

A simplified schematic view of the LNA is shown in FIG. 3 to further illustrate the noise canceling mechanism. FIG. 3 is a simplified schematic diagram illustrating the noise canceling principle for the LNA exemplary embodiment of FIG. 2.

NMOS transistor $M_{2n}$ represents the transconductance gm2 of the pair of complementary MOS transistors 250 and 252 used as the first amplifier in FIG. 2. NMOS transistor $M_{3n}$ represents the transconductance gm3 of transistor 260 used as the second amplifier in FIG. 2.

Noise current source 270 represents the noise current In due to MOS transistor 220 included in the input stage circuit of FIG. 2. Resistor 280 has a value equal to $r_{ds}$ and represents the total output impedance of the pair of complementary MOS transistors 250 and 252.

The noise current of MOS transistor 220 which is modeled by the current source 270, flows into node 200 but out of node 210. This creates two fully correlated noise voltages with opposite phases. The first noise voltage $_{V1}$, at node 200, equals to alpha*In*Rs and the second noise voltage $_{V2}$, at node 210, equals to -alpha*In*$R_L$. These two voltages are converted to currents by the first and the second amplifier, respectively. By properly selecting transconductances $g_{m2}$ and $g_{m3}$, the noise contributed by MOS transistor 220 can be cancelled at the output of the LNA. On the other hand, the signal voltages at nodes 200 and 210 are in phase, resulting in constructive addition at the output. The condition for complete noise cancellation is derived by the following equation as:

$$\alpha I_n \cdot R_S \cdot g_{m2n} \cdot \frac{r_{ds}}{r_{ds} + \frac{1}{g_{m3}}} = \alpha I_n \cdot R_L \cdot \frac{1}{r_{ds} + \frac{1}{g_{m3}}} \rightarrow R_s \cdot g_{m2n} r_{ds} = R_L$$

Assuming a degeneration factor β:

$$\beta \equiv \frac{g_{m3} r_{ds}}{1 + g_{m3} r_{ds}}$$

The gain of the LNA is $$A_v = g_{m1} \cdot R_L \cdot \frac{g_{m3}}{1 + g_{m3}r_{ds}} + g_{m2n} \cdot \frac{g_{m3}r_{ds}}{1 + g_{m3}r_{ds}} \Rightarrow 2g_{m2n}\beta$$

and the Noise Factor is:

$$NF = 1 + \frac{\left[\frac{4KTR_L}{R_{DG}^2} + \frac{4KT \cdot NEF}{g_{m3}R_{DG}^2} + \frac{4KT}{R_{DG}} + 4KT \cdot NEF \cdot g_{m2n}\right] \cdot \beta^2}{4KTR_S \cdot \frac{1}{4} \cdot 4\beta^2 \cdot g_{m2n}^2}$$

$$\Rightarrow 1 + \frac{1}{(g_{m2}R_{DG})} +$$

$$\frac{NEF}{(g_{m2}R_S)(g_{m2}R_{DG})(g_{m3}R_{DG})} + \frac{1}{(g_{m2}R_S)(g_{m2}R_{DG})} + \frac{NEF}{(g_{m2}R_S)}$$

$$\Rightarrow 1 + \frac{NEF}{(g_{m2}R_S)} = 1 + \frac{2\beta \cdot NEF}{A_V R_S}$$

Degeneration factor β is typically lower than one and helps to provide a design tradeoff between power consumption and noise figure.

Figure 4:
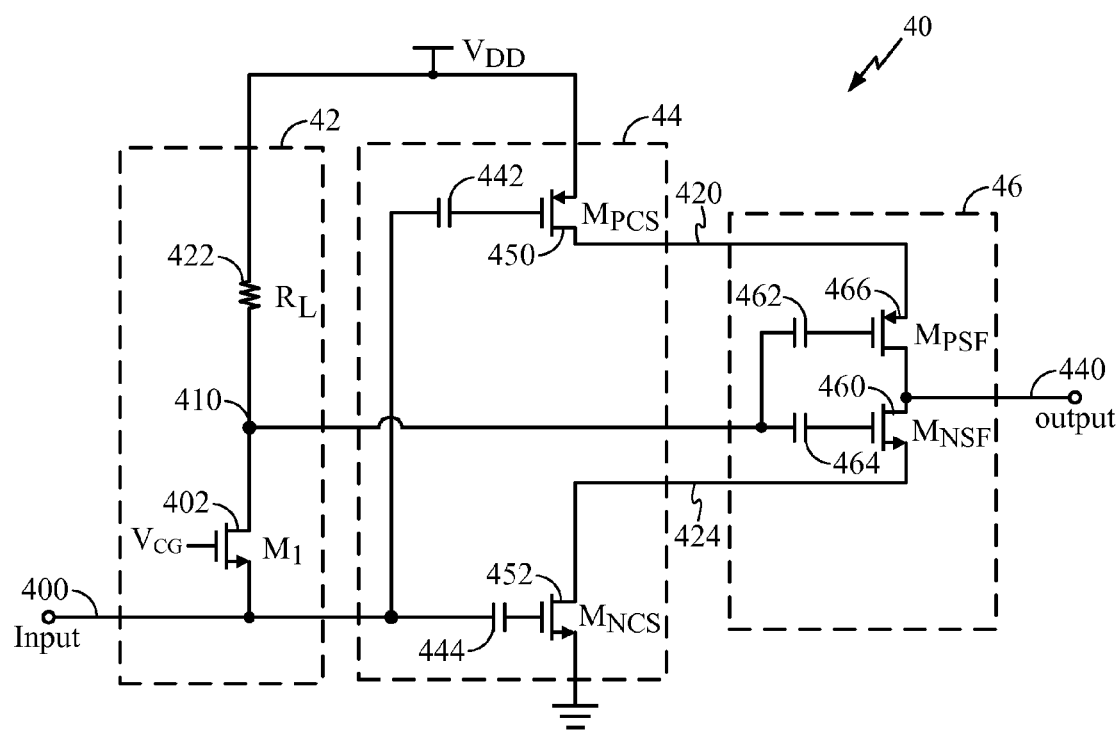
FIG. 4 is a schematic diagram of another embodiment of an LNA with noise canceling.

FIG. 4 is a schematic diagram of another embodiment of an LNA with noise canceling.

LNA 40 includes input stage circuit 42, first amplifier 44 and second amplifier 46. Input stage circuit 40, includes MOS transistor 402 ($M_1$) in a common gate configuration coupled to load resistor 422 ($R_L$). First amplifier 44 includes a first pair of complementary MOS transistors 450, 452 ($M_{PCS}$, $M_{NCS}$) and capacitors 442 and 444. Second amplifier 46 comprises a second pair of MOS transistors 466, 460 ($M_{PSF}$, $M_{NSF}$) and capacitors 462 and 464.

The gates of the first pair of complementary MOS transistors 450, 452 ($M_{PCS}$, $M_{NCS}$) are coupled to input terminal 400 of the LNA through capacitors 442 and 444, respectively. The source of MOS transistor 450 is coupled to the positive supply and the drain of MOS transistor 450 is coupled to the source of MOS transistor 466. The drain of MOS transistor 466 is coupled to the drain of MOS transistor 460 and to the output of the LNA. The source of MOS transistor 460 is coupled to the drain of MOS transistor 452. The source of MOS transistor 452 is coupled to ground.

The gates of the second pair of complementary MOS transistors 466, 460 ($M_{PSF}$, $M_{NSF}$) are coupled to an output of input stage circuit 42 through capacitors 462 and 464 respectively.

First amplifier 44 senses a first noise voltage appearing at node 400. Node 400 is the input of the LNA. The first amplifier converts the first noise voltage into a first noise current. The first noise current is a differential signal appearing at nodes 420 and 424. Nodes 420 and 424 are the outputs of the first amplifier.

Second amplifier 46 senses a second noise voltage appearing at node 410. Node 410 is the output of the input stage circuit. The second noise voltage is proportional to the first noise voltage. Second amplifier 46 converts the second noise voltage into a second noise current, which appears at node 440. Node 440 is the output of the second amplifier and is also the output of the LNA.

Second amplifier 46 sums the first and the second noise currents at the output of the LNA in such a way that the first and the second noise currents substantially cancel each other. As a result, the noise due to the input stage circuit is substantially canceled at the output of the LNA.

The transconductance of the first amplifier is a function of the transconductance of the second amplifier in order to set the first noise current equal and of opposite sign to the second noise current.

The first amplifier is directly coupled, dc coupled, to the second amplifier. As a result, the LNA uses smaller ac capacitors when compared with previous solutions such as that shown in FIG. 1.

The first and the second amplifier are combined in a way that they share current as the current at the differential output of the first amplifier is fed directly to the sources of the second pair of MOS transistors. Current sharing results in a low current implementation when compared to traditional implementations that use ac coupling between the LNA amplification stages.

Exemplary embodiments of the disclosed LNA such as those shown in FIG. 2 and FIG. 4 when used for an FM receiver demonstrate at least 30% die area reduction over previous solutions.

The LNA provides for dc coupling between amplification stages of the LNA thus allows current reuse between a first and a second amplifier making the proposed solutions low power.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A low noise amplifier (LNA) comprising:
    an input stage circuit to receive an RF signal and having a first node and a second node;
    a first amplifier including a pair of complementary MOS transistors each coupled to the first node through a pair of capacitors, respectively, to convert a first noise voltage at the first node into a first noise current at an output of the first amplifier; and
    a second amplifier including a MOS transistor having its gate coupled to the second node through a capacitor, its drain coupled to an output terminal of the LNA and its source coupled to the output of the first amplifier, the second amplifier providing noise canceling by summing the first noise current with a second noise current generated by the second amplifier as a function of the noise voltage at the second node.

2. The LNA of claim 1, where the input stage circuit sets the second noise voltage proportional to the first noise voltage.

3. The LNA of claim 1, where the transconductance of the first amplifier is a function of the transconductance of the second amplifier in such a way that the first noise current is equal and of opposite sign to the second noise current.

4. The LNA of claim 1, where the source of the first MOS transistor of the pair of complementary transistors is coupled to the positive supply and where the drain of the first MOS transistor of the pair is coupled to the drain of the second MOS transistor of the pair.

5. The LNA of claim 4, where the source of the second MOS transistor of the pair is coupled to ground.

6. The LNA of claim 1, further comprising a resistor having one terminal coupled to the source of the MOS transistor of the second amplifier and another terminal coupled to ground.

7. The LNA of claim 4, further comprising a MOS transistor, where its gate is coupled to the input terminal of the LNA through a capacitor, its source is coupled to the positive power supply and its drain coupled to the output of the LNA.

8. The LNA of claim 5, where the input stage is a MOS transistor in a common gate configuration coupled to a load resistor.

9. A low noise amplifier (LNA), comprising:
    means for receiving an RF signal and having a first node and a second node;
    first means for amplifying a first voltage signal as a function of an RF signal, and including a pair of complementary MOS transistors each coupled to the first node through a pair of capacitors, respectively, to convert a first noise voltage at the first node into a first noise current at an output of the first means; and
    second means, dc coupled to the first means, for amplifying a second voltage signal as a function of the RF signal, where the second means includes a MOS transistor having its gate coupled to the second node through a capacitor, its drain coupled to an output terminal of the LNA and its source coupled to the output of the first means, the second means providing noise canceling by summing the first noise current with a second noise current generated by the second means as a function of the noise voltage at the second node.

10. The LNA of claim 9, where the means for receiving an RF signal sets the second noise voltage proportional to the first noise voltage.

11. The LNA of claim 9, where the transconductance of the first means is a function of the transconductance of the second means in such a way that the first noise current is equal and of opposite sign to the second noise current.

* * * * *